United States Patent
Yu et al.

(10) Patent No.: US 9,647,653 B2
(45) Date of Patent: May 9, 2017

(54) METHOD FOR REDUCED POWER CLOCK FREQUENCY MONITORING

(71) Applicant: Apple Inc., Cupertino, CA (US)

(72) Inventors: Shu-Yi Yu, Sunnyvale, CA (US); Jean-Didier Allegrucci, Sunnyvale, CA (US); Timothy Paaske, Cupertino, CA (US); Deniz Balkan, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/730,473

(22) Filed: Jun. 4, 2015

(65) Prior Publication Data

US 2016/0359476 A1    Dec. 8, 2016

(51) Int. Cl.
*H03K 5/19* (2006.01)
*H03K 5/26* (2006.01)

(52) U.S. Cl.
CPC ............... *H03K 5/19* (2013.01); *H03K 5/26* (2013.01)

(58) Field of Classification Search
CPC ..... G06F 1/00; G06F 1/08; G06F 7/00; G06F 7/68; H03K 5/00; H03K 5/00006; H03K 5/19; H03K 5/26; H03K 23/00; H03K 23/667; H03K 23/68

USPC .......................................................... 327/115
See application file for complete search history.

(56) References Cited

U.S. PATENT DOCUMENTS

| | | |
|---|---|---|
| 7,080,001 B2 | 7/2006 | Moriyama et al. |
| 8,378,710 B1 | 2/2013 | Al-Kadi et al. |
| 8,412,996 B2 | 4/2013 | Bancel et al. |
| 8,909,971 B2 | 12/2014 | Zinke et al. |
| 8,937,496 B1 | 1/2015 | Ahmad et al. |
| 2014/0232434 A1* | 8/2014 | Koazechi et al. ........ G06F 1/08 327/40 |

* cited by examiner

*Primary Examiner* — Lincoln Donovan
*Assistant Examiner* — David Mattison
(74) *Attorney, Agent, or Firm* — Meyertons, Hood, Kivlin, Kowert & Goetzel, P.C.

(57) ABSTRACT

An apparatus may include first and second clock monitors. The first clock monitor may be configured to receive a first clock signal and assert a first signal if the frequency of the first clock signal is greater than a first upper threshold and assert a second signal if the frequency of the first clock signal is less than a first lower threshold. The second clock monitor may be configured to receive a second clock signal with a frequency higher than that of the first clock signal. The second clock monitor may be configured to compare the second clock signal, dependent upon the first clock signal, to second upper and lower thresholds and assert a third signal if the frequency of the second clock signal is greater than the second upper threshold and assert a fourth signal if the frequency is less than the second lower threshold.

20 Claims, 6 Drawing Sheets

METHOD FOR REDUCED POWER CLOCK FREQUENCY MONITORING

BACKGROUND

Technical Field

Embodiments described herein are related to the field of integrated circuit implementation, and more particularly to the implementation of clock signal frequency monitors.

Description of the Related Art

Computing systems may include one or more systems-on-a-chip (SoCs), which may integrate a number of different functions, such as, application execution, graphics processing and audio processing, onto a single integrated circuit. With numerous functions included in a single integrated circuit, chip count may be kept low in mobile computing systems, such as tablets, for example, which may result in reduced assembly costs, and a smaller form factor for such mobile computing systems.

SoC designs may include one or more clock signal generators, configured to output a clock signal at a target frequency. Proper operation of some SoC designs may require clock signals with frequencies within a given range of the target frequency. If a clock frequency is too low or too high, logic circuits clocked by these clock signals may not perform correctly. Some SoCs include clock monitors, also referred to herein as frequency monitors, to indicate if a given clock signal is operating at a proper frequency. Generally speaking, a frequency monitor detects if the frequency of a clock signal is above or below a predetermined threshold value. Other frequency monitors may determine if the frequency of the clock signal is within a predetermined frequency range.

SUMMARY OF THE EMBODIMENTS

Various embodiments of a clock signal frequency monitoring unit are disclosed. Broadly speaking, a system, an apparatus, and a method are contemplated in which the apparatus includes a first clock monitoring circuit that may be configured to receive a first clock signal and to assert a first signal in response to a determination that the frequency of the first clock signal is greater than a first upper threshold value; and to assert a second signal in response to a determination that the frequency of the first clock signal is less than a first lower threshold value. The apparatus also includes a second clock monitoring circuit that may be configured to receive a second clock signal, wherein a frequency of the second clock signal is higher than a frequency of the first clock signal. The second clock monitor may also be configured to compare, dependent upon the first clock signal, the frequency of the second clock signal to a second upper threshold value and a second lower threshold value. The second clock monitor may be configured to assert a third signal if the frequency of the second clock signal is greater than the second upper threshold value and to assert a fourth signal if the frequency of the second clock signal is less than the second lower threshold value.

In a further embodiment, to compare the frequency of the second clock signal to the first expected frequency, the second clock monitoring circuit may be further configured to determine a number of rising transitions of the second clock signal occurring during a given duration of the first clock signal. In another embodiment, a power consumption of the second clock monitoring circuit may be less than a power consumption of the first clock monitoring circuit.

In one embodiment, the apparatus may include a third clock monitoring circuit configured to receive a third clock signal, wherein a frequency of the third clock signal is higher than the frequency of the first clock signal. The third clock monitoring circuit may also be configured to compare, dependent upon the first clock signal, the frequency of the third clock signal to a third upper threshold value and a third lower threshold value. The third clock monitoring circuit may be further configured to assert a fifth signal if the frequency of the third clock signal is greater than the third upper threshold value; and assert a sixth signal if the frequency of the third clock signal is less than the third lower threshold value.

In another embodiment, the frequency of the second clock signal may be dependent upon the frequency of the first clock signal. In one embodiment, the frequency of the second clock signal may be selectable, and the second upper threshold value and second lower threshold value may be determined dependent upon the selected frequency of the second clock signal. In a further embodiment, the second upper threshold value and the second lower threshold value may be independently selectable.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

A system on a chip (SoC) may include one or more functional blocks, such as, e.g., a processor and one or more memories, which may integrate the function of a computing system onto a single integrated circuit. Some SoC designs may utilize a high frequency clock signal to maximize the performance capabilities of the SoC. In some embodiments, certain functional units of the SoC may expect that the frequency of these clock signals fall within predetermined ranges in order to function properly. Failure to maintain the frequency within the predetermined frequency range may cause failure of one or more of the functional units which may lead to unpredictable behavior of the system.

The frequency of a clock signal may deviate from an intended, or "target," frequency unintentionally. For example, some clock circuits, such as a crystal oscillator circuit for example, may deviate to a multiple of the target frequency due to an interfering signal from another part of the device or from another device, due to a power supply disruption such as a voltage spike, or due to a physical force such as the device being dropped.

In other cases, the frequency of a clock signal may deviate from the target frequency due to an intentional manipulation of the clock signal in an attempt to breach security features of the device by exploiting circuits that are sensitive to the frequency of received clock signals by disabling or bypassing security features of an SoC by over-clocking (running the SoC above a maximum specified frequency) or under-clocking (running the SoC below a minimum specified frequency). Such security attacks may be referred to as a "frequency attacks."

To protect against unintentional and intentional deviations in the frequency of a clock signal, some SoCs include clock monitors (also referred to herein as "frequency monitors"). In some embodiments, a clock monitor circuit asserts a signal whenever a frequency of a monitored clock signal crosses a predetermined threshold. The asserted signal can be used to trigger an interrupt or exception to a processor within the SoC and during the servicing of the interrupt/exception a clock generation unit can be adjusted or reset. In some embodiments, a chip reset may be asserted in place of the interrupt/exception.

One embodiment of a clock monitor may be designed for a high level of accuracy. In other words, such a clock monitor is designed to detect relatively small changes in frequency of a monitored clock signal. This clock monitor may rely on analog components for monitoring the frequency of the clock signal. These analog components may cause the clock monitor to consume more current as the frequency of the monitored clock signal is increased. In some designs, an analog-based clock monitor design may be more desirable for monitoring clock signals with lower frequencies, such as, for example frequencies below one megahertz.

Another embodiment of a clock monitor may be designed for lower power operation with higher frequency clock signals. Such a clock monitor may rely on digital components more than analog components. In some semiconductor manufacturing processes, however, operational characteristics of digital circuits may not have tight tolerances and may, therefore, not provide a desired level of accuracy when monitoring a clock signal.

As used herein, "analog components" and "analog circuits" refer to circuit components and circuits that are designed to react to or act on signals with a continuously variable range voltage levels. In contrast, "digital components" and "digital circuits" refer to circuit components and circuits that are designed to interpret a voltage level of a signal as either a "high" voltage level or a "low" voltage level, i.e., one of two states.

The embodiments illustrated in the drawings and described below may provide for a clock monitoring circuit that combines accuracy and reduced power consumption when monitoring high frequency clock signals. Additional embodiments may also provide for monitoring multiple clock high frequency clock signals.

Figure 1:
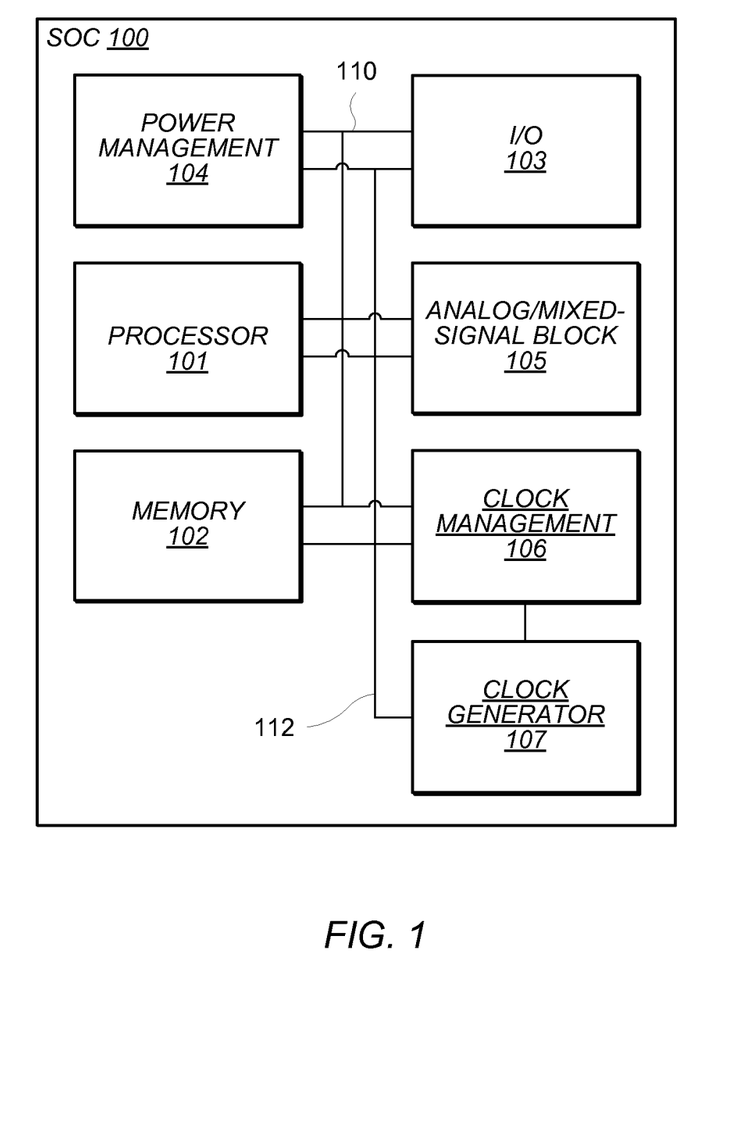
FIG. 1 illustrates an embodiment of a system-on-a-chip (SoC).

A block diagram of an embodiment of an SoC is illustrated in FIG. 1. In the illustrated embodiment, SoC 100 includes processor 101 coupled to memory block 102, I/O block 103, power management unit 104, analog/mixed-signal block 105, clock management unit 106, all coupled through bus 110. Additionally, clock generator 107 may be coupled to clock management unit 106 and provide a clock signal 112 to the functional blocks in SoC 100. In various embodiments, SoC 100 may be configured for use in a mobile computing application such as, e.g., a tablet computer, smartphone or wearable device.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores and may include one or more register files and memories.

In various embodiments, processor 101 may implement any suitable instruction set architecture (ISA), such as, e.g., PowerPC™, or x86 ISAs, or combination thereof. Processor 101 may include one or more bus transceiver units that allow processor 101 to communication to other functional blocks via bus 110, such as, memory block 102, for example.

Memory block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include a single memory, such as memory block 102 and other embodiments may include more than two memory blocks (not shown). In some embodiments, memory block 102 may be configured to store program instructions that may be executed by processor 101. Memory block 102 may, in other embodiments, be configured to store data to be processed, such as graphics data, for example. Memory block 102, may, in some embodiments, include a memory controller for interfacing to memory external to SoC 100, such as, for example, one or more DRAM chips.

I/O block 103 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. I/O block 103 may include general-purpose input/output pins (I/O pins). In some embodiments, I/O block 103 may be configured to implement a version of Universal Serial Bus (USB) protocol, IEEE 1394 (Firewire®) protocol, or, and may allow for program code and/or program instructions to be transferred from a peripheral storage device for execution by processor 101. In one embodiment, I/O block 103 may be configured to perform the data processing necessary to implement an Ethernet (IEEE 802.3) networking standard.

Power management unit 104 may be configured to manage power delivery to some or all of the functional blocks included in SoC 100. Power management unit 104 may comprise sub-blocks for managing multiple power supplies for various functional blocks. In various embodiments, the power supplies may be located in analog/mixed-signal block 105, in power management unit 104, in other blocks within SoC 100, or come from external to SoC 100, coupled through power supply pins. Power management unit 104 may include one or more voltage regulators to adjust outputs of the power supplies to various voltage levels as required by functional blocks in SoC 100, such as for reduced power modes, for example.

Analog/mixed-signal block 105 may include a variety of circuits including, for example, a crystal oscillator, an internal oscillator, a phase-locked loop (PLL), delay-locked loop (DLL), or frequency-locked loop (FLL). One or more analog-to-digital converters (ADCs) or digital-to-analog converters (DACs) may also be included in analog/mixed signal block 105. In some embodiments, analog/mixed-signal block 105 may also include radio frequency (RF) circuits that may be configured for operation with cellular telephone networks. Analog/mixed-signal block 105 may include one or more voltage regulators to supply one or more voltages to various functional blocks and circuits within those blocks.

Clock management unit 106 may be configured to enable, configure and monitor outputs of one or more clock sources. In various embodiments, the clock sources may be located in clock generator 107, analog/mixed-signal block 105, within clock management unit 106, in other blocks within SoC 100, or come from external to SoC 100, coupled through one or more I/O pins. In some embodiments, clock management 106 may be capable of configuring a selected clock source before it is distributed throughout SoC 100. Clock management unit 106 may include registers for selecting an output frequency or reference clock of a PLL, FLL, DLL, or other type of closed-loop clock source.

Clock generator 107 may be a sub-module of analog/mixed signal block 105 or clock management unit 106. In other embodiments, clock generator 107 may be a separate module within SoC 100. One or more clock sources may be included in clock generator 107. In some embodiments, clock generator 107 may include PLLs, FLLs, DLLs, internal oscillators, oscillator circuits for external crystals, etc.

One or more clock signal outputs 112 may provide clock signals to various functional blocks of SoC 100.

System bus 110 may be configured as one or more buses to couple processor 101 to the other functional blocks within the SoC 100 such as, e.g., memory block 102, and I/O block 103. In some embodiments, system bus 110 may include interfaces coupled to one or more of the functional blocks that allow a particular functional block to communicate through the bus. In some embodiments, system bus 110 may allow movement of data and transactions (i.e., requests and responses) between functional blocks without intervention from processor 101. For example, data received through the I/O block 103 may be stored directly to memory block 102.

SoC 100 may be implemented in any suitable IC manufacturing process, such as, for example, a Complementary MOSFET (CMOS) processes. A Metal-Oxide-Semiconductor Field-Effect Transistor (MOSFET) describes a type of transistor that may be used in modern digital logic designs. MOSFETs are designed as one of two basic types, n-channel and p-channel. CMOS describes a circuit designed with a mix of re-channel and p-channel MOSFETs. In CMOS designs, n-channel and p-channel MOSFETs may be arranged such that a high level on the gate of a MOSFET turns an re-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that the SoC illustrated in FIG. 1 is merely an example. In other embodiments, different functional blocks and different configurations of functions blocks may be possible dependent upon the specific application for which the SoC is intended.

Figure 2:
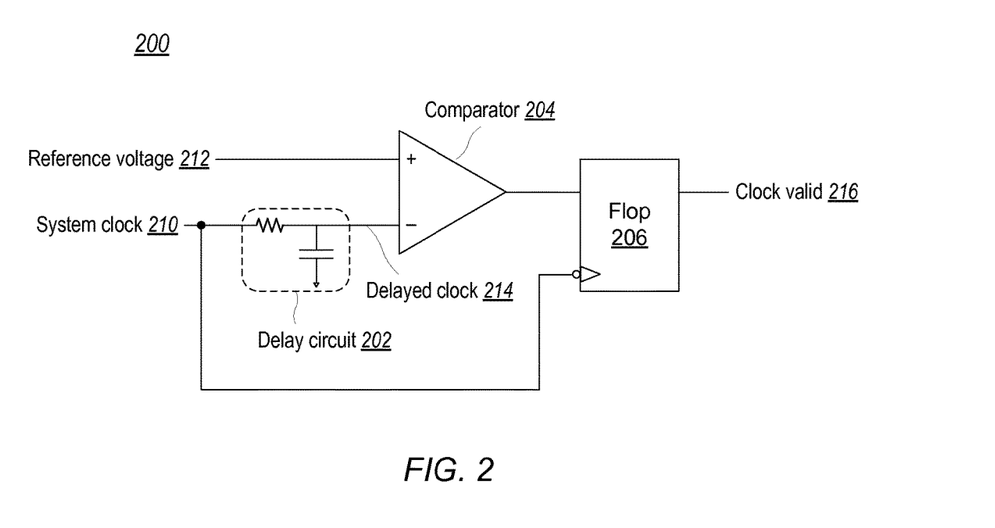
FIG. 2 illustrates a first embodiment of a block diagram of a clock monitoring circuit.

Turning to FIG. 2, a first embodiment of a block diagram of a clock monitoring circuit is illustrated. Clock monitor 200 may correspond to a component or sub-component within an SoC, such as, SoC 100. Clock monitor 200 includes delay circuit 202, comparator circuit 204, and flip-flop 206. Input signals system clock 210 and reference voltage 212 are received by clock monitor 200 and clock valid signal 216 is output. Delayed clock signal 214 is an intermediate signal from delay circuit 202 to comparator circuit 204.

System clock 210 is received by delay circuit 202. In the present embodiment, delay circuit 202 is implemented as a resistor and capacitor that will charge when system clock 210 is a logic high and discharge when system clock 210 is a logic low. In other embodiments, delay circuit may be any suitable circuit that charges and discharges in response to system clock 210 changing logic states, in particular circuits that use analog components to determine the amount of delay. Delayed clock 214 is output from delay circuit 202 and is received by comparator circuit 204.

It is noted that "logic high", "high", "high state", or "high level" refers to a voltage sufficiently large to turn on a n-channel MOSFET and turn off a p-channel MOSFET, while "logic low", "low", "low state", or "low level" refers to a voltage that is sufficiently small enough to do the opposite. In other embodiments, different technology may result in different voltage levels for "low" and "high."

Comparator circuit 204 receives delayed clock 214 and reference voltage 212 as inputs. While a voltage level of delayed clock 214 is below a voltage level of reference voltage 212, the output of comparator circuit 204 is a logic high. When the voltage level of delayed clock 214 rises above the level of reference voltage 212, the output of comparator 204 is at a low logic level. The level of reference voltage 212 is set in conjunction with the component values for delay circuit 202 to correspond to a particular frequency, or range of frequencies, of system clock 210. This relationship will be detailed further in the description of FIG. 3 below.

The output of comparator 204 is sent to an input of flip-flop (Flop) 206. Flip-flop 206 may be implemented as any suitable circuit, such as a D-type flip-flop, capable of latching a value of an input at a falling transition of an input clock signal. In this embodiment, system clock 210 is the input clock signal to flip-flop 206. In this configuration, flip-flop 206 captures the state of comparator circuit 204 at the falling transition of system clock 210. The output of flip-flop 206 will, therefore, be at a high logic level if the frequency of system clock 210 is higher than a corresponding threshold and be a logic low if the frequency is lower than the threshold.

It is noted that a "clock transition," as used herein (which may also be referred to as a "clock edge" in some embodiments) refers to a clock signal changing from a first logic value to a second logic value. A clock transition may be "rising" if the clock signal goes from a low value to a high value, and "falling" if the clock signal goes from a high to a low.

Figure 3:
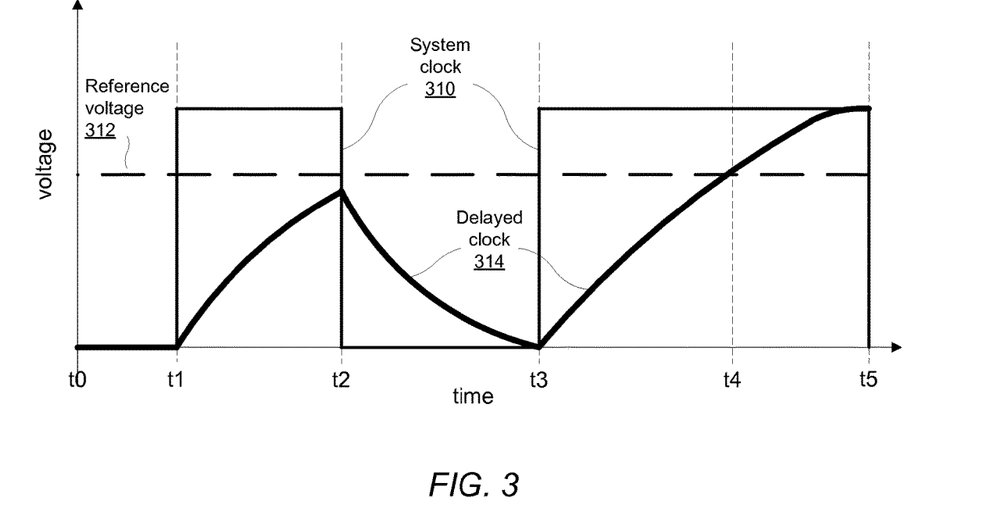
FIG. 3 shows a first timing diagram illustrating possible signals of an embodiment of the clock monitoring circuit of FIG. 2.

FIG. 3 illustrates the operation of the clock monitor circuit of FIG. 2. The graph of FIG. 3 overlays three signals from the present embodiment of clock monitor 200, with time represented on the horizontal axis and voltage level on the vertical axis. System clock 310, reference voltage 312, and delayed clock 314 correspond to their respective similarly named and numbered signals in FIG. 2.

At time t0, system clock 310 is low due, for example, to being disabled. Reference voltage 312 is at a predetermined voltage level and delayed clock 314 is low, corresponding to the low state of system clock 310. The output of comparator circuit 204 will be high under these conditions. At time t1, system clock 310 is enabled and transitions high. In response to the transition of system clock 310, delayed clock 314 begins to rise. The rate at which the voltage level of delayed clock 314 rises (also referred to as the "rise time") is dependent upon the values of components used in delay circuit 202. At time t2, system clock 310 transitions back to a low state. Delayed clock 314 has not had sufficient time to rise above reference voltage 312, so the output of comparator circuit 204 remains high and delayed clock 314 begins to fall towards the low state. The falling transition of system clock 310 also causes flip-flop 206 to capture the output of comparator circuit 204 as a logic high.

At time t3, system clock 310 transitions high again. Delayed clock 314 again starts to rise towards the logic high voltage level. At time t4, system clock 310 has remained high for a longer period of time than between times t1 and t2, and delayed clock 314 has, therefore, risen above reference voltage 312. As a result, the output of comparator circuit 204 transitions low. Flip-flop 206 captures the low state of the output of comparator 204 at time t5 when system clock 310 transitions low.

The graph of FIG. 3 demonstrates how clock monitor 200 may be used to compare the frequency of system clock 310 to a threshold frequency determined by the rise time of delay circuit 202 and the level of reference voltage 212. At frequencies higher than the threshold frequency, delayed clock 314 does not have enough time to rise above reference voltage 312, while frequencies lower than the threshold do allow enough time for delayed clock 314 to rise past reference voltage 312.

In some embodiments, however, clock monitor 200 may not be a suitable implementation for monitoring some clock signals. For example, as the frequency of a clock signal rises, the voltage level of reference voltage 312 is lowered and/or the values of components of delay circuit 202 are lowered to reduce the rise time. A lower reference voltage may make comparator 204 more sensitive to voltage fluctuations in the system, such as may be caused by other circuits in an SoC. In addition, smaller component values in delay circuit 202 may be harder to manufacture consistently, particularly in an logic IC manufacturing process, such as CMOS, for example.

It is noted that the block diagram of FIG. 2 and the graph of FIG. 3 are merely examples. Various embodiments of clock monitor 200 are contemplated. For example, delay circuit 202 may be implemented by a number of known delay circuits and the polarity of comparator circuit 204 may be reversed. Furthermore, the signals in FIG. 3 are simplified to provide clear descriptions of the disclosed concepts. In various embodiments, the signals may appear different due various influences such as technology choices for building the circuits, actual circuit design and layout, ambient noise in the environment, choice of power supplies, etc.

Figure 4:
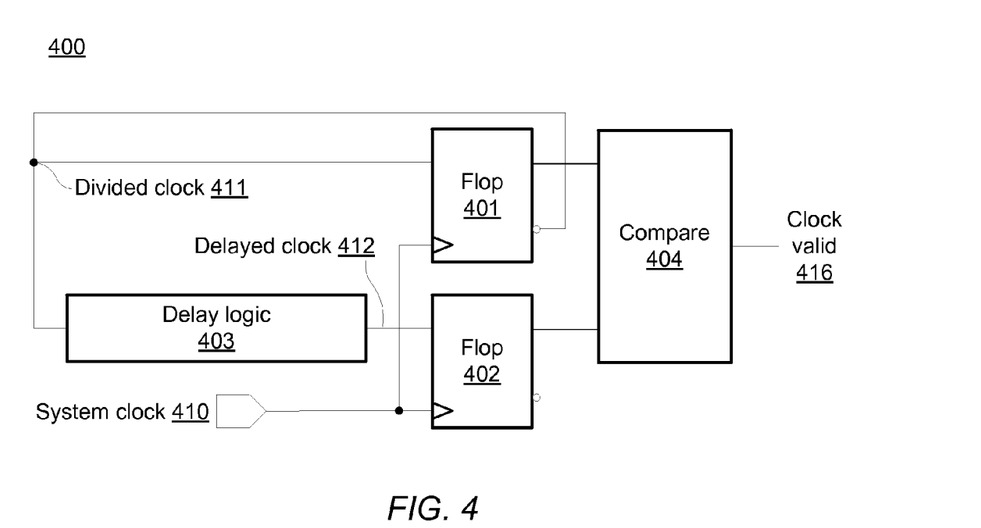
FIG. 4 illustrates a second embodiment of a block diagram of a clock monitoring circuit.

Moving to FIG. 4, a second embodiment of a block diagram of a clock monitoring circuit is illustrated. Clock monitor 400 includes flip-flop circuits 401 and 402, delay logic 403, and comparison circuit (compare) 404. Clock monitor 400 receives system clock 410 as a clock signal whose frequency is to be monitored and outputs clock valid signal 416. Divided clock 411 and delayed clock 412 are two signals generated internally and used to monitor the frequency of system clock 410.

System clock 410 is used as the clock signal input to both flip-flop 401 and 402, causing each flip-flop to latch the value received at each flip-flop's input at a rising transition of system clock 410. An inverted output of flip-flop 401, denoted by the small circle, is sent back as the input of flip-flop 401 and the input to delay logic 403 as divided clock 411. In the present embodiment, flip-flop 401 will toggle the logic state of its output after every rising edge of system clock 410, thereby creating divided clock 411 with a frequency one-half of the frequency of system clock 410.

Delay logic 403 receives divided clock 411 and outputs a similar signal, delayed clock 412, that has been shifted by a predetermined amount of time. In other words, a rising transition of divided clock 411 corresponds to a rising transition of delayed clock 412 delayed by the predetermined amount of time. Delay logic 403 evenly delays both rising and falling transitions of delayed clock 412 from divided clock 411, resulting in delayed clock 412 and divided clock 411 having the same frequency. Delay logic 403 may be implemented using any suitable, predominately logic-based, delay elements. For example, a traditional inverter, transmission gates, cascaded inverters, voltage-controlled inverters, current-starved inverters, differential amplifier delay cells, inverters with Schmitt triggers, etc., may be used as delay elements.

Flip-flop 402 receives delayed clock 412 and latches its state on the rising transitions of system clock 410, i.e., the same time that flip-flop 401 latches the state of divide clock 411. Outputs of both flip-flops 401 and 402 are received by comparison circuit 404. Comparison circuit 404 generates clock valid signal 416 dependent on the compared states of the two flip-flop outputs. For example, clock valid 416 may be high if the two received signals are the same and low otherwise, or vice versa. The predetermined delay time of delay logic 403 determines the frequency which serves as the threshold for deciding between a valid and an invalid clock frequency.

Figure 5:
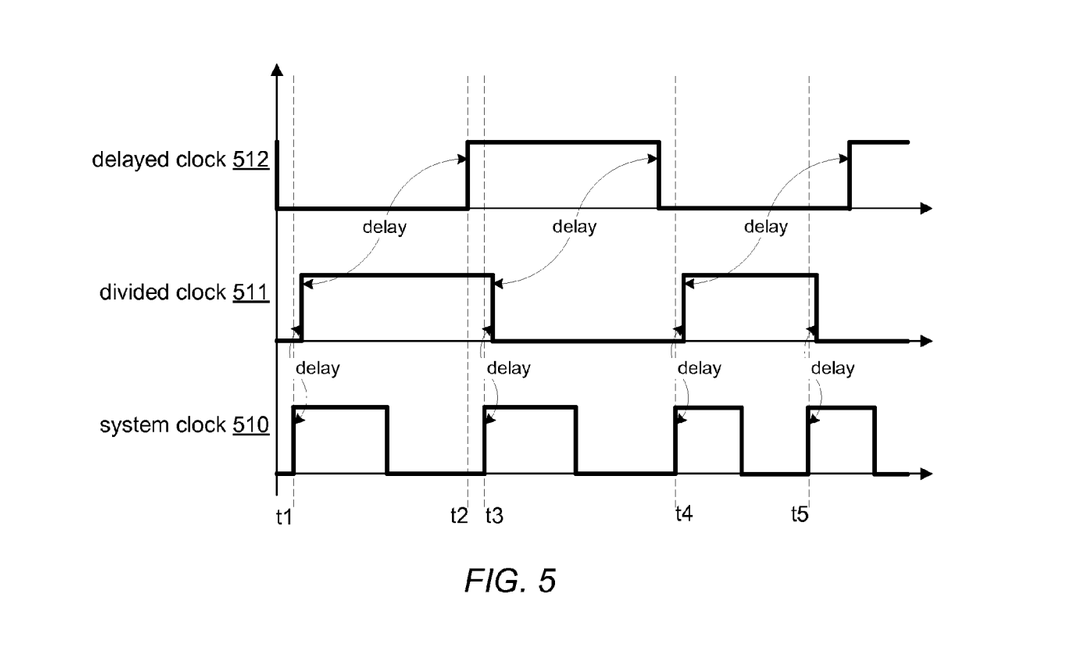
FIG. 5 illustrates a second timing diagram showing possible signals of an embodiment of the clock monitoring circuit of FIG. 4.

The timing diagram of FIG. 5 illustrates signals of an embodiment of clock monitoring circuit 400 of FIG. 4 to demonstrate how clock monitor 400 operates. The timing diagram of FIG. 5 includes three signals, system clock 510, divided clock 511 and delayed clock 512. Each of the illustrated signals may correspond to the similarly named signal in FIG. 4.

At time t1, system clock 510 transitions high. After a brief delay divided clock 511 also transitions high in response to the transition of system clock 510. It is noted that flip-flops and other similar logic circuits may have a delay between when an input signal transitions to when the output transitions in response to the input. This delay is sometimes referred to as a "propagation delay" and may result from a time required for circuits to change state of an output in response to the change of the input. Although the waveforms in FIG. 5 illustrate a signal as changing from low to high or high to low instantaneously, transistors included in the circuits have rise and fall times for these transitions. Depending on a given circuit's design, an input signal may pass through several transistors before reaching an output signal, in which case the rise and fall times for each transistor may add to a total propagation delay.

At time t2, delayed clock 512 transitions from low to high in response to the earlier transition of divided clock 511. The elapsed time of the delay from divided clock 511 to delayed clock 512 is determined based on the design and settings of delay logic 403. System clock 510 has another low to high transition at time t3. This transition causes flip-flops 401 and 402 to latch the state of their respective inputs, which is a high state for both divided clock 511 and delayed clock 512. Note that in this case, the delay time is less than one period (i.e., t1 to t3) of system clock 510. Comparison circuit 404 updates a value of clock valid 416 dependent upon these latched values.

Another low to high transition occurs on system clock 510 at time t4, and the current states of divided clock 511 and delayed clock 512 (both low) are again latched by flip-flops 401 and 402 and clock valid 416 remains unchanged from the previous value. Also after time t4, the frequency of system clock 510 is increased and the time between t4 and t5 is less than the time between t1 and t3. In this case, the delay time of delay logic 403 is greater than the period of system clock 510. At time t5, when system clock 510 transitions high again, divided clock 511 is latched by flip-flop 401 in a high state and delayed clock 512 is latched by flip-flop 402 in a low state. These inverse values of the latched states result in comparison circuit 404 toggling the state of the clock valid signal 416.

The timing diagram of FIG. 5 demonstrates how clock monitor 400 may be used to determine if a frequency of a clock signal is above or below a predetermined threshold. In some embodiments, however, clock monitor 400 may not be an acceptable solution for some SoC implementations. Logic circuits used to create delay logic 403 may be difficult to manufacture with consistent delay values from chip to chip. These logic circuits may also be sensitive to changes in operating voltage or temperatures, thereby affecting the delay time and the overall accuracy of the clock monitor.

It is noted that clock monitor 400 of FIG. 4 and the timing diagram of FIG. 5 merely illustrate an example embodiment of a clock monitor. Various forms of logic-based clock monitors are known and contemplated. The signals of FIG. 5 are simplified to provide clear descriptions of the disclosed concepts. In various embodiments, the signals may appear different due various influences such as technology choices for building the circuits, actual circuit design and layout, ambient noise in the environment, choice of power supplies, etc.

Figure 6:
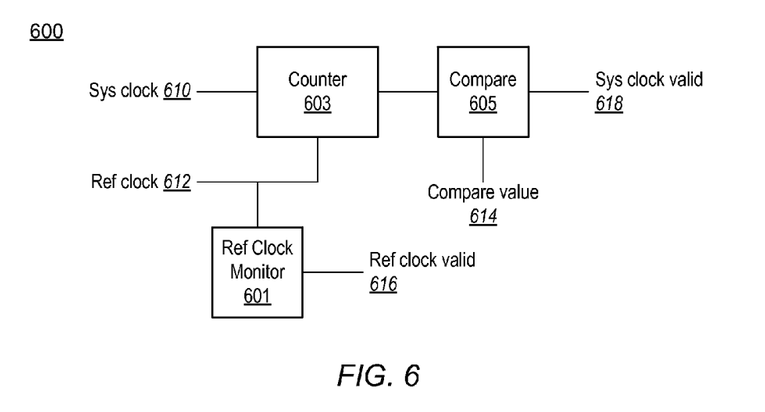
FIG. 6 shows an embodiment of a block diagram of a clock monitoring system.

Turning now to FIG. 6, a block diagram of an embodiment of a clock monitoring system is shown. Clock monitor 600 includes reference clock monitor 601, counter circuit 603 and comparison unit 605. Clock monitor 600 receives input signals system clock 610, reference clock 612, and compare value 614. Two output signals are generated, reference clock valid 616 and system clock valid 618.

Clock monitor 600 may be viewed as a two stage monitoring system. Generation and monitoring of reference clock 612 may be considered as the first stage. Using reference clock 612 as a time base for monitoring system clock 610 may be considered as the second stage. In some embodiments, reference clock 612 may be generated by a crystal oscillator in clock generator 107 or analog/mixed signal block 105 in FIG. 1. In other embodiments, reference clock 612 may be internally generated within clock monitor 600 by a ring oscillator circuit, for example. In either implementation, a frequency of reference clock 612 is monitored by reference clock monitor 601. Reference clock monitor 601 may correspond to clock monitor 200 of FIG. 2 or clock monitor 400 of FIG. 4, or any other suitable clock monitor circuit capable of accurately detecting the frequency of reference clock 612. In some embodiments, a clock monitoring circuit that uses analog components for setting frequency thresholds, such as clock monitor 200, for example, may provide more accurate monitoring of reference clock 612.

In the present embodiment, reference clock monitor 601 includes two clock monitoring circuits, one to detect reference clock 612 reaching an upper frequency limit and another to detect reference clock 612 reaching a lower frequency limit, thereby establishing an operating frequency range. In other embodiments, a single clock monitoring circuit may be used for detecting both upper and lower limits. Reference clock monitor 601 generates the output signal reference clock valid 616. The value of reference clock valid 616 indicates if the frequency of reference clock 612 is within the valid operating frequency range or not.

Counter circuit 603 receives both system clock 610 and reference clock 612. The frequency of reference clock 612 is lower than system clock 610. In some embodiments, the frequency of reference clock 612 may be one order of magnitude less than system clock 610. In other embodiments, reference clock 612 may be several orders of magnitude different. For example, reference clock 612 may be less than one megahertz while system clock 610 may be over 100 megahertz or greater than one gigahertz.

It is noted that in some embodiments of clock monitor 600, reference clock 610 and system clock 612 may be asynchronous. In such embodiments, additional circuits may be included in counter circuit 603 to synchronize transitions of reference clock 612 to the transitions of system clock 610. In addition, the synchronized transitions of reference clock 612 may correspond to clock pulses generated by a pulse generator circuit.

Counter circuit 603 is used to count a number of clock cycles occurring in system clock 610 within one clock cycle of reference clock 612. In other embodiments, clock cycles of system clock 610 may be counted over two or more cycles of reference clock 612. The number of system clock 610 clock cycles counted is sent to comparison unit 605.

Since the frequency of reference clock is known to be within a valid operating range dependent on the value of reference clock valid 616, an expected frequency of system clock 610 will produce a determinate number of cycles during a cycle of reference clock 612. Comparison unit 605 compares the received number of cycles from counter circuit 603 to compare value 614, i.e., an expected number of cycles determined based on the expected frequency of system clock 610. Compare value 614 may be a constant value hard-coded into the design of compare unit 605 for a single frequency of system clock 610. In other embodiments, particularly if the frequency of system clock 610 is adjustable, compare value 614 may be programmable and set based on a current frequency setting of system clock 610. Comparison unit 605 may also receive two or more comparison values to establish a valid frequency range, one comparison value to set an upper limit and another to set a lower frequency limit. The output signal system clock valid 618 indicates if the frequency of system clock 610 is within the valid frequency range or not.

It is noted that clock monitor 600 of FIG. 6 is merely an example of a clock monitoring system. The block diagram of FIG. 6 has been simplified to highlight features relevant to this disclosure. Various embodiments may include functional blocks, such as, for example a synchronizing circuit and/or a pulse generation circuit.

Figure 7:
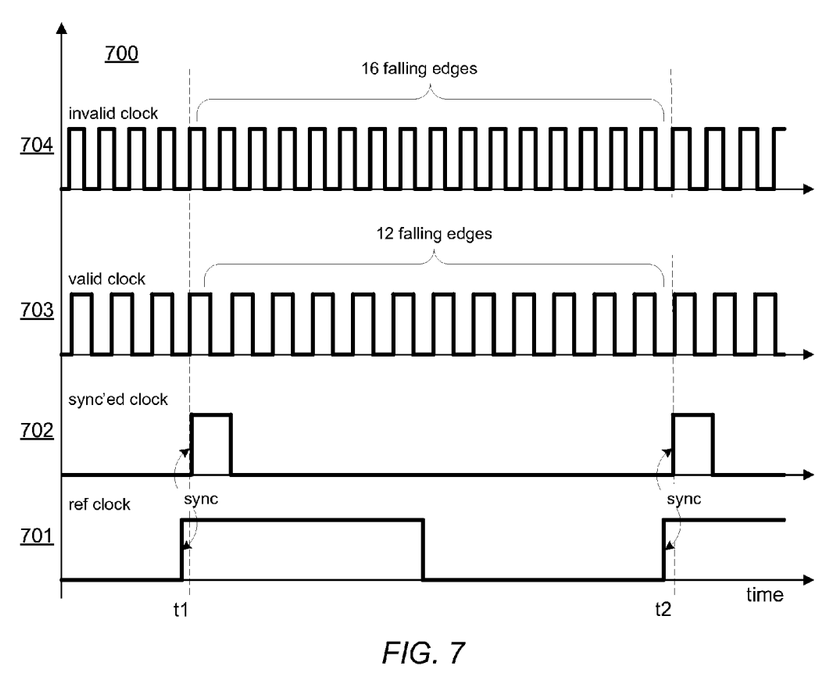
FIG. 7 show a timing diagram illustrating possible signals of an embodiment of the clock monitoring system of FIG. 6.

Moving now to FIG. 7, a timing diagram is illustrated showing possible signals from the operation of an embodiment of clock monitor 600 in FIG. 6. Timing diagram 700 includes the signals: reference clock 701, corresponding to reference clock 612 in FIG. 6; synchronized clock 702, representing a synchronization of rising transitions of reference clock 701 to transitions of a received system clock; valid clock 703, corresponding to a received system clock signal 610 with a valid frequency; and invalid clock 704, corresponding to a received system clock signal 610 with a frequency that is too high.

At time t1, a rising transition of reference clock 701 results in a synchronized pulse being generated on synchronized clock 702. This pulse on synchronized clock 702 causes counter circuit 603 to reset a counter register to zero and begin counting clock pulses of the system clock. At time t2, a subsequent rising transition of reference clock 701 results in a second pulse on synchronized clock 702. This second pulse causes counter circuit 603 to buffer a current count value and reset the counter register to zero and begin counting for a next cycle of reference clock 701. The buffered value is sent to compare unit 605 to determine if the frequency of the system clock is within a valid frequency range.

It is noted that to count a given cycle of a system clock, counter circuit 603 may increment the counter register on a rising transition of the clock cycle, the falling transition of the clock cycle, or after a combination of a rising and falling transition. For the present embodiment, since reference clock 701 is synchronized to the rising edges of the system clock, counter circuit 603 increments the count register on the falling edges of the system clock.

In the illustrated example, assume an upper count limit is 14 and a lower count limit is 10. When the system clock corresponds to valid clock 703, 12 falling edges are counted, falling between the upper and lower limits of 14 and 10, corresponding to a valid frequency. Compare unit 605 updates a value of system clock valid 618 to indicate a valid clock signal. When the system clock corresponds to invalid clock 704, however, 16 falling edges are counted, falling above the upper limit of 14. Compare unit 605 updates the value of system clock valid to indicate the monitored clock frequency is out of range. In various embodiments, the out of range indication of system clock valid may cause an interrupt or exception to be serviced by a processor, such as processor 101 in FIG. 1, or may cause a reset of SoC 100, or may cause a clock generator responsible for the system clock to disable the output of the system clock.

The timing diagram of FIG. 7 demonstrates how clock monitor 600 may be used to validate a system clock by using a reference clock 701 that is also monitored. If the frequency of the reference clock is lower than the frequency of the system clock being monitored, then a clock monitor such as, for example, clock monitor 200 or clock monitor 400 may be used to monitor the lower frequency clock signal within an acceptable range of accuracy and power consumption. The counter circuits and comparison units used to monitor the higher frequency system clock may only add a limited amount of power consumption while achieving accuracy approaching the accuracy of the implemented reference clock monitor.

It is noted that timing diagram 700 of FIG. 7 is merely an example. The signals of FIG. 7 are simplified to provide clear descriptions of the disclosed concepts. In various embodiments, the signals may appear different due various influences such as technology choices for building the circuits, actual circuit design and layout, ambient noise in the environment, choice of power supplies, etc.

Figure 8:
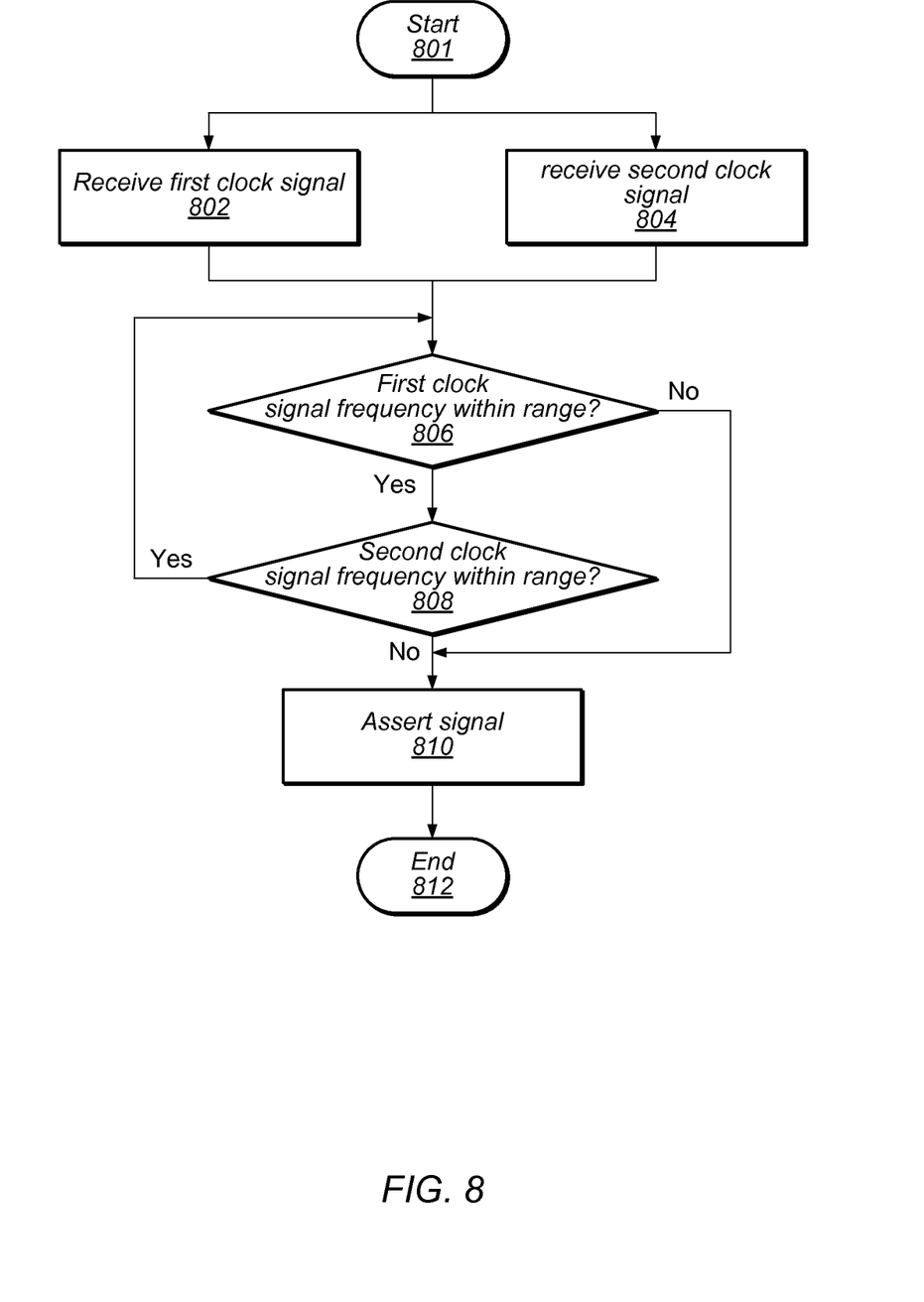
FIG. 8 depicts a flowchart illustrating an embodiment of a method for monitoring a frequency of two clock signals.

Turning to FIG. 8, a flowchart of an embodiment of a method for monitoring a frequency of two clock signals is illustrated. The method may be applied to a clock monitoring system, such as, for example, clock monitor 600 in FIG. 6, in a system such as SoC 100 in FIG. 1. Referring collectively to SoC 100, clock monitor 600, and the flowchart in FIG. 8, the method begins in block 801.

A first clock signal is received by reference clock monitor 601 (block 802). Reference clock monitor 601 may correspond to any suitable type of clock monitoring circuit that does not require a second clock signal in addition to the monitored clock signal. For example, reference clock monitor 601 may correspond to clock monitor 200 in FIG. 2 or clock monitor 400 in FIG. 4. Reference clock monitor 601 includes a first lower frequency threshold and a first upper frequency threshold and outputs a reference clock valid signal indicating if the frequency of the first clock signal is between the first upper and lower thresholds or not. In some embodiments, two clock valid signals may be used, a first to indicate if the frequency of the first clock signal is above the first upper threshold and a second to indicate if the frequency is below the first lower threshold.

Clock monitor 600 receives a second clock signal at counter circuit 603 (block 804). The frequency of the second clock signal is greater than the frequency of the first clock signal. Counter circuit 603 also receives the first clock signal and uses it as a time base for determining the frequency of the second clock signal. Counter circuit 603 counts cycles of the second clock signal occurring during a given cycle of the first clock signal. The counted number of clock cycles is sent to comparison unit 605.

Further operations of the method may depend on a frequency of the first clock signal (block 806). Reference clock monitor 601 monitors the frequency of the first clock signal and if the frequency is between the first upper and lower frequency thresholds, the method moves to block 808. Otherwise, if the frequency of the first clock signal is above the upper threshold or below the lower threshold, the method moves to block 810 to signal to SoC 100 that the frequency of the first clock signal is outside of its valid frequency of range.

Further operations of the method may depend on a frequency of the second clock signal (block 808). Comparison unit 605 receives the counted number of clock cycles and compares this number to a lower threshold count and an upper threshold count. The lower and upper threshold counts correspond to a second lower frequency threshold and a second upper frequency threshold, respectively. If the frequency of the second clock signal is determined to be between the second frequency thresholds, then the method returns to block 806 to repeat the monitoring process. Otherwise, the method moves to block 810 to signal to SoC 100 that the frequency of the second clock signal is outside of its valid frequency range.

If the frequency of either the first clock signal or the second clock signal is outside of its respective valid frequency range, then clock monitor 600 updates a corresponding clock valid signal (block 810). If the frequency of the first clock signal is outside of its valid frequency range, then reference clock monitor 601 asserts reference clock valid signal 616. Otherwise, if the frequency of the second clock signal is outside of its valid frequency range, then comparison circuit 605 asserts the system clock valid signal 618. In various embodiments, in response to an indication that the frequency of either the first clock signal or the second clock signal is out of range, SoC 100 may assert an exception or interrupt to processor 101, reset SoC 100, disable functional blocks that are sensitive to out of range clock frequencies, or cause a corresponding clock generator circuit to disable the out of range clock signal.

In some embodiments, four clock valid signals may be used, a first to indicate if the frequency of the first clock signal is above the first upper threshold, and a second to indicate if the frequency is below the first lower threshold. A third clock valid signal may be used to indicate if the frequency of the second clock signal is above the second upper threshold, and a fourth to indicate if the frequency is below the second lower threshold. In addition, a memory location, such as in memory 102, for example, may be used to store a time stamp indicating the occurrence of the clock signal operating out of the valid frequency range. The time stamp may include available information such as, for example, which clock signal was out of range, if the signal was above or below the valid range, or values corresponding to an actual frequency of the clock signal (i.e., the count value from counter circuit 603).

It is noted that the method illustrated in FIG. 8 is merely an example embodiment. Variations on this method are possible and contemplated for example, some operations may be performed in a different sequence, and/or additional operations may be included. Moreover, some operations, although depicted as being performed in series, may, in other embodiments, be performed in parallel. For example, operation 806 may occur in parallel with operation 808 despite being shown in series.

Figure 9:
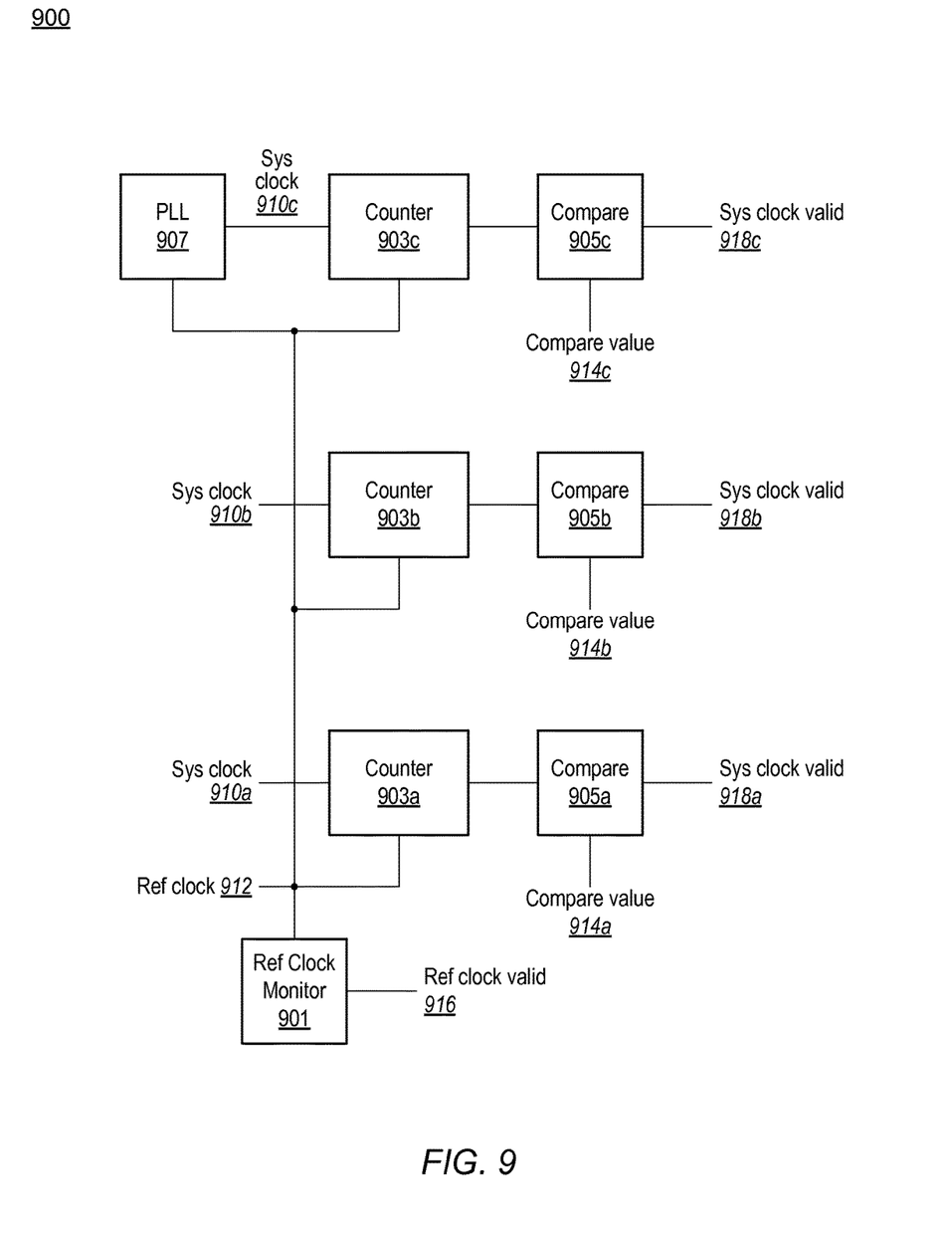
FIG. 9 illustrates a second embodiment of a block diagram of a clock monitoring system.

Moving to FIG. 9, a second embodiment of a block diagram of a clock monitoring system is shown. Clock monitor system 900 uses a similar method of monitoring as used by clock monitor 600 in FIG. 6. Clock monitor system 900, however, may be used to monitor more than two clocks at once. The illustrated embodiment of clock monitor system 900 includes features and circuits similar to clock monitor 600. For example, clock monitor system 900 includes reference clock monitor 901, which corresponds to reference clock monitor 601. Clock monitor system 900 also includes counter circuits 903a-c and comparison units 905a-c, each of which correspond to counter circuit 603 and comparison unit 605, respectively. In addition, clock monitor system 900 includes phased-locked loop (PLL) 907.

Reference clock monitor 901, counter circuit 903a and comparison unit 905a combined essentially form an embodiment of clock monitor 600, with system clock 910a, reference clock 912, compare value 914a, and system clock valid 918a corresponding to the similarly named signals in FIG. 6. The operation of this portion of clock monitor system 900 corresponds to the method of FIG. 8. Clock monitor system 900 adds capabilities to monitor two additional clock signals, system clocks 910b-c, while reusing reference clock 912 and reference clock monitor 901. Reuse of reference clock monitor 901 potentially saves die area on an IC including clock monitor 900. In addition, power consumption may be reduced by not having to generate and monitor three independent versions of reference clock 912.

Counter circuits 903a-c may be implemented individually, or as a single functional block with three counter registers and support logic to increment each counter dependent upon the respective system clock input. Comparison units 905a-c may also be implemented individually, or as a single functional block with independent compare values 914a-c and system clock valid signals 918a-c. In some embodiments, system clock valid signals may be combined into a single system clock valid signal 918 that indicates if all system clock signals are operating with valid frequencies or if any one or more of the system signals is operating with an out of range frequency. As long as independent compare values 914a-c are used, then each system clock 910a-c may have an individual clock valid frequency range.

Each respective pair of counter circuit 903 and comparison unit 905 is used to monitor a corresponding system clock 910, using the same reference clock 912. In some embodiments, a frequency of a given system clock 910 may not be greater than the frequency of the reference clock 912. In such an embodiment, reference clock 912 may be divided sufficiently within the respective counter 903 to create a divided reference clock with a lower frequency than that of the given system clock.

FIG. 9 also illustrates how reference clock 912 and system clock 910c may be synchronized. PLL 907 receives reference clock 912 as an input and outputs system clock 910c with a frequency dependent upon the frequency of reference clock 912. Although a PLL is illustrated in FIG. 9, any suitable type of closed loop clock generation circuit may be used. If system clock 910c and reference clock 912 are synchronized through use of a PLL or other similar clock generation circuit, then synchronization circuits, such as described above in regards to FIG. 6, may be excluded from counter circuit 903c.

As used herein, a "closed-loop" clock signal generators refers to a clock circuit that uses an adjustable high-frequency oscillator to generate a clock signal and continuously or periodically monitor the clock signal frequency by comparing the generated clock signal to a higher-accuracy, lower-frequency reference clock. Some examples of such closed-loop clock generators include phase-locked loops (PLLs), delay-locked loops (DLLs), and frequency-locked loops (FLLs).

It is noted that the embodiment of clock monitor system 900 is merely an example for presenting disclosed concepts. In other embodiments, additional functional units may be included or illustrated units may be omitted. Although three system clock signals 910 are shown, any suitable number of system clock signals may be monitored by including corresponding circuits.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a first clock monitoring circuit configured to:
        receive a first clock signal;
        assert a first signal in response to a determination that a frequency of the first clock signal is greater than a first upper threshold value; and
        assert a second signal in response to a determination that the frequency of the first clock signal is less than a first lower threshold value; and
    a second clock monitoring circuit configured to:
        receive a second clock signal, wherein a frequency of the second clock signal is higher than a frequency of the first clock signal;
        compare, dependent upon the first clock signal, the frequency of the second clock signal to a second upper threshold value and a second lower threshold value;
        assert a third signal if the frequency of the second clock signal is greater than the second upper threshold value; and
        assert a fourth signal if the frequency of the second clock signal is less than the second lower threshold value;
    wherein a power consumption of the second clock monitoring circuit is less than a power consumption of the first clock monitoring circuit.

2. The apparatus of claim 1, wherein to compare the frequency of the second clock signal to the second upper threshold value and the second lower threshold value, the second clock monitoring circuit is further configured to determine a number of rising transitions of the second clock signal occurring during a given duration of the first clock signal.

3. The apparatus of claim 1, wherein the second clock monitoring circuit is further configured to, in response to the assertion of the third signal or the fourth signal, store a value corresponding to a time when the assertion occurs.

4. The apparatus of claim 1, further comprising a third clock monitoring circuit configured to:
    receive a third clock signal, wherein a frequency of the third clock signal is higher than the frequency of the first clock signal;
    compare, dependent upon the first clock signal, the frequency of the third clock signal to a third upper threshold value and a third lower threshold value;
    assert a fifth signal if the frequency of the third clock signal is greater than the third upper threshold value; and
    assert a sixth signal if the frequency of the third clock signal is less than the third lower threshold value.

5. The apparatus of claim 1, wherein the frequency of the second clock signal is dependent upon the frequency of the first clock signal.

6. The apparatus of claim 1, wherein the frequency of the second clock signal is selectable, and wherein the second upper threshold value and second lower threshold value are determined dependent upon the selected frequency of the second clock signal.

7. The apparatus of claim 1, wherein the second upper threshold value and second lower threshold value are independently selectable.

8. A method, comprising:
    receiving a first clock signal;
    asserting a first signal in response to a determination that a frequency of the first clock signal is greater than a first upper threshold value;
    asserting a second signal in response to a determination that the frequency of the first clock signal is less than a first lower threshold value;
    receiving a second clock signal, wherein a frequency of the second clock signal is higher than a frequency of the first clock signal;
    comparing, dependent upon the first clock signal, the frequency of the second clock signal to a second upper threshold value and a second lower threshold value;
    asserting a third signal if the frequency of the second clock signal is greater than the second upper threshold value; and
    asserting a fourth signal if the frequency of the second clock signal is less than the second lower threshold value;
    wherein the frequency of the second clock signal is dependent upon the frequency of the first clock signal.

9. The method of claim 8, wherein comparing the frequency of the second clock signal to the second upper threshold value and the second lower threshold value, further comprises determining a number of rising transitions of the second clock signal occurring during a given duration of the first clock signal.

10. The method of claim 8, further comprising:
    receiving a third clock signal, wherein a frequency of the third clock signal is higher than the frequency of the first clock signal;
    comparing, dependent upon the first clock signal, the frequency of the third clock signal to a third upper threshold value and a third lower threshold value;
    asserting a fifth signal if the frequency of the third clock signal is greater than the third upper threshold value; and
    asserting a sixth signal if the frequency of the third clock signal is less than the third lower threshold value.

11. The method of claim 8, further comprising, in response to asserting the third signal or the fourth signal, storing a value corresponding to a time when the third signal or the fourth signal is asserted.

12. The method of claim 8, wherein the frequency of the second clock signal is selectable and wherein the second upper threshold value and second lower threshold value are determined dependent upon the selected frequency of the second clock signal.

13. The method of claim 8, wherein the second upper threshold value and second lower threshold value are independently selectable.

14. The method of claim 8, further comprising generating a reset signal in response to an assertion of the third signal or an assertion of the fourth signal.

15. A system comprising:
a first clock source configured to generate a first clock signal;
a second clock source configured to generate a second clock signal, wherein a frequency of the second clock signal is higher than a frequency of the first clock signal; and
a clock monitoring unit configured to:
receive the first clock signal;
assert a first signal in response to a determination that the frequency of the first clock signal is greater than a first upper threshold value;
assert a second signal in response to a determination that the frequency of the first clock signal is less than a first lower threshold value;
receive a second clock signal;
compare, dependent upon the first clock signal, the frequency of the second clock signal to a second upper threshold value and a second lower threshold value;
assert a third signal if the frequency of the second clock signal is greater than the second upper threshold value; and
assert a fourth signal if the frequency of the second clock signal is less than the second lower threshold value;
wherein the frequency of the second clock signal is dependent upon the frequency of the first clock signal.

16. The system of claim 15, wherein to compare the frequency of the second clock signal to the second upper threshold value and the second lower threshold value, the clock monitoring unit is further configured to determine a number of rising transitions of the second clock signal occurring during a given duration of the first clock signal.

17. The system of claim 15, wherein the clock monitoring unit is further configured to:
receive a third clock signal, wherein a frequency of the third clock signal is higher than the frequency of the first clock signal;
compare, dependent upon the first clock signal, the frequency of the third clock signal to a third upper threshold value and a third lower threshold value;
assert a fifth signal if the frequency of the third clock signal is greater than the third upper threshold value; and
assert a sixth signal if the frequency of the third clock signal is less than the third lower threshold value.

18. The system of claim 15, wherein the clock monitoring unit is further configured to, in response to the assertion of the third signal or the fourth signal, store a value corresponding to a time when the assertion occurs.

19. The system of claim 15, wherein the first clock source is further configured to cease generating the first clock signal in response to the assertion of the first signal or the assertion of the second signal.

20. The system of claim 15, wherein the second clock source is further configured to cease generating the second clock signal in response to the assertion of the third signal or the assertion of the fourth signal.

* * * * *